United States Patent
Agrawal et al.

(10) Patent No.: US 10,862,493 B2
(45) Date of Patent: *Dec. 8, 2020

(54) TECHNIQUES TO IMPROVE LINEARITY OF R-2R LADDER DIGITAL-TO-ANALOG CONVERTERS (DACS)

(71) Applicant: TEXAS INSTRUMENTS INCORPORATED, Dallas, TX (US)

(72) Inventors: Atul Kumar Agrawal, Bengaluru (IN); Gautam Salil Nandi, Bengaluru (IN); Siddharth Malhotra, Panchkula (IN); Tanmay Neema, Indore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/854,077

(22) Filed: Apr. 21, 2020

(65) Prior Publication Data

US 2020/0252073 A1   Aug. 6, 2020

Related U.S. Application Data

(63) Continuation of application No. 16/197,132, filed on Nov. 20, 2018, now Pat. No. 10,673,450.

(51) Int. Cl.
| | |
|---|---|
| *H03M 1/10* | (2006.01) |
| *H03M 1/12* | (2006.01) |
| *H03M 13/11* | (2006.01) |

(52) U.S. Cl.
CPC ........ *H03M 1/1009* (2013.01); *H03M 1/1014* (2013.01); *H03M 1/1245* (2013.01); *H03M 13/1145* (2013.01)

(58) Field of Classification Search
CPC .......... H03M 1/1009; H03M 13/1145; H03M 1/1245; H03M 1/1014
USPC ......................................... 341/155, 144, 120
See application file for complete search history.

(56) References Cited

U.S. PATENT DOCUMENTS

| | | | | |
|---|---|---|---|---|
| 4,899,152 A | * | 2/1990 | Barrow | G04F 1/005 341/119 |
| 6,377,197 B1 | * | 4/2002 | Rantanen | H03M 1/1014 341/118 |
| 8,681,026 B2 | * | 3/2014 | Xiao | H03M 1/1047 341/118 |
| 9,970,825 B2 | * | 5/2018 | Zanbaghi | G01K 7/01 |

* cited by examiner

*Primary Examiner* — Brian K Young
(74) *Attorney, Agent, or Firm* — John R. Pessetto; Charles A. Brill; Frank D. Cimino

(57) ABSTRACT

An integrated circuit includes a digital-to-analog converter (DAC) core including a plurality of thermometric arms and an R-2R ladder, the DAC core to convert a DAC code to an analog signal. The integrated circuit includes additional components as well. A differential non-linearity (DNL) calibration circuit outputs DNL coefficients based on the DAC code. A memory stores a value indicative of a product of a resistor temperature coefficient (TC) and a resistor self-heating coefficient (SHC). A current DAC (IDAC) couples to the R-2R ladder. A self-heating calibration circuit generates a self-heating trim code based on the value from the memory. An adder adds a value indicative of the DNL coefficients with the self-heating trim code to generate an IDAC trim code and provides the IDAC trim code to the IDAC to trim the R-2R ladder.

12 Claims, 7 Drawing Sheets

TECHNIQUES TO IMPROVE LINEARITY OF R-2R LADDER DIGITAL-TO-ANALOG CONVERTERS (DACS)

CROSS REFERENCE TO RELATED APPLICATION(S)

This continuation application is related to U.S. patent application Ser. No. 16/197,132, filed Nov. 20, 2018, which is hereby incorporated herein by reference in its entirety.

BACKGROUND

A digital-to-analog converter (DAC) receives an input DAC code, which is a multi-bit binary value, and produces an output analog signal (e.g., an analog voltage). One parameter that defines a DAC is its precision (i.e., the number of bits of the input DAC code). Another parameter is the range of the analog output signal. DACs are usable in a wide variety of applications. Some applications (e.g., programmable precisions voltage sources in test and measurement applications) benefit from higher precision and larger output voltage ranges. For example, an application may use a 20-bit DAC whose analog output voltage may be as high as 30V. Using a low voltage DAC core followed by a high gain buffer results in added noise from the gain buffer, and thus may not be satisfactory in some applications. Of multiple available DAC architectures, a DAC that uses an "R-2R" ladder is generally satisfactory for higher voltage and higher precision applications.

SUMMARY

In one illustrative implementation, an integrated circuit includes a digital-to-analog converter (DAC) core including a plurality of thermometric arms and an R-2R ladder, the DAC core to convert a DAC code to an analog signal. The integrated circuit includes additional components as well. A differential non-linearity (DNL) calibration circuit outputs DNL coefficients based on the DAC code. A memory stores a value indicative of a product of a resistor temperature coefficient (TC) and a resistor self-heating coefficient (SHC). A current DAC (IDAC) couples to the R-2R ladder. A self-heating calibration circuit generates a self-heating trim code based on the value from the memory. An adder adds a value indicative of the DNL coefficients with the self-heating trim code to generate an IDAC trim code and provides the IDAC trim code to the IDAC to trim the R-2R ladder.

BRIEF DESCRIPTION OF THE DRAWINGS

For a detailed description of various examples, reference will now be made to the accompanying drawings in which.

DETAILED DESCRIPTION

An R-2R ladder DAC includes a network of resistors (an example is presented below) that is connectable to two reference voltages based on the DAC code to be converted to an analog signal (e.g., voltage). The resistors in the R-2R ladder are nominally the same, but due to process and other effects, the resistors do not all have exactly the same resistance thereby creating differential non-linearity (DNL) error. DNL error refers to the difference between the actual step change in analog output voltage corresponding to 1 least significant bit (LSB) change in the input DAC code and the ideal step change for the analog voltage. DNL error can be reduced by trimming the R-2R ladder. However, other causes of non-linearity may remain. This disclosure addresses two such causes of non-linearity: (1) self-heating of the unit resistors in the R-2R ladder; and (2) DNL drift with temperature due to random and systematic mismatches in the temperature coefficients of the unit resistors.

Figure 1:
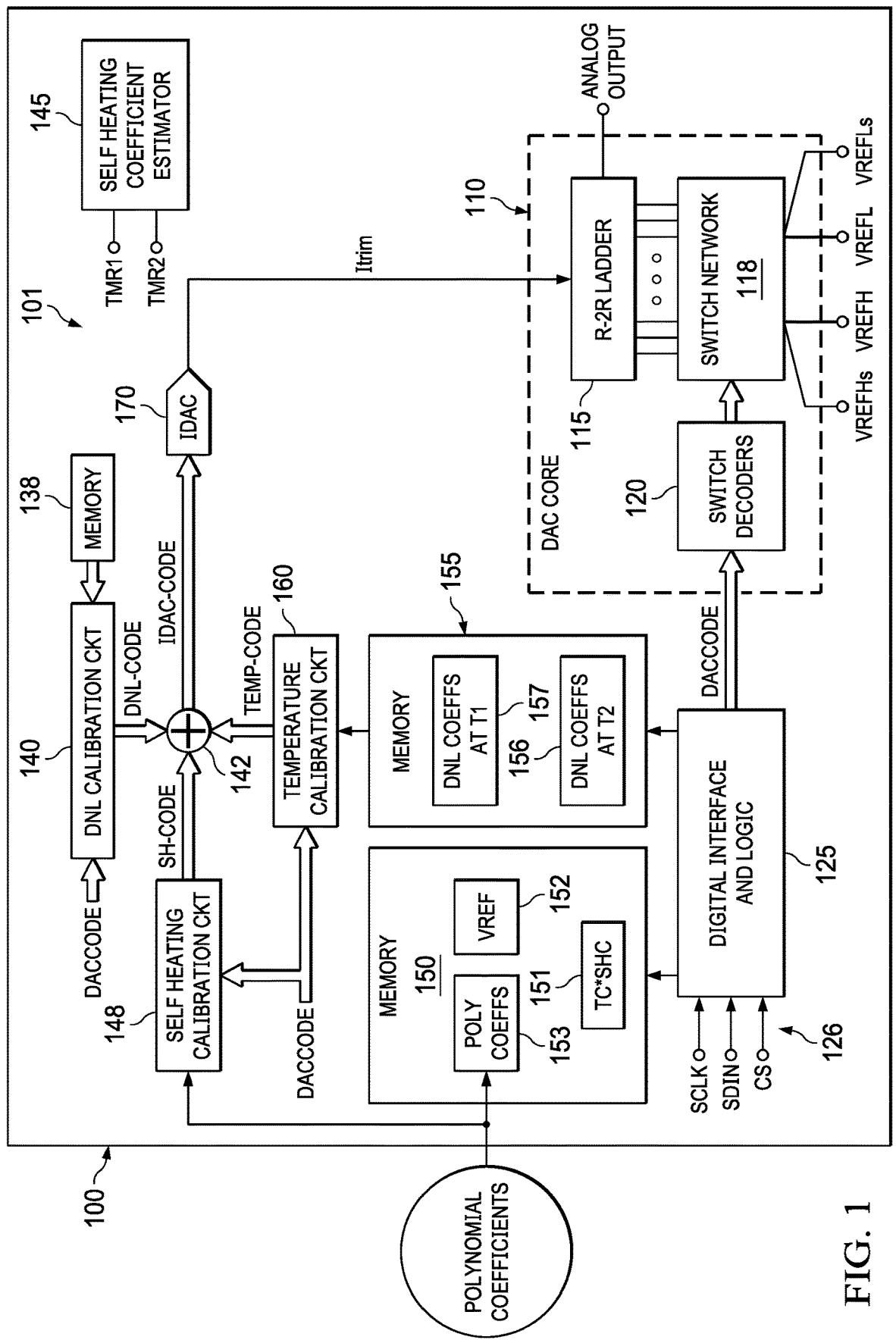
FIG. 1 illustrates a digital-to-analog converter (DAC) in accordance with an example.

FIG. 1 shows an example of an integrated circuit 100 comprising a DAC 101. The DAC 101 fabricated on the integrated circuit 100 in this example includes a DAC core 110, a digital interface and logic 125, memories 138, 150 and 155 (which can be separate memory devices or one memory device), a DNL calibration circuit 140, an adder 142, a self-heating coefficient estimator 145, a self-heating calibration circuit 148, a temperature calibration circuit 160, and a current DAC (IDAC) 170. The DAC core converts an input DAC code (DACCODE) received from the digital interface and logic 125 to analog output voltage. The digital interface and logic 125 implements an interface 126 which is usable to receive data and configuration parameters from a source external to the integrated circuit 100. In one example, the interface 126 comprises a serial interface such as an inter-integrated circuit (I2C) interface or a serial peripheral interface (SPI). Digital data to be converted to an analog voltage is provided to the digital interface and logic 125 via the interface 126 (e.g., over the SDIN data input line of the interface as shown). Configuration parameters usable by the DAC 101 also can be provided over the interface 126 to the digital interface and logic 125 for storage in one or more of memories 138, 150, and 155.

The digital interface and logic 125 may include a buffer which stores the incoming digital values and then provides DACCODEs from the buffer to the DAC core 110 for conversion to the output analog voltage. The DAC core 110 in this example includes an R-2R ladder 115, a switch network 118, and switch decoders 120.

Figure 2:
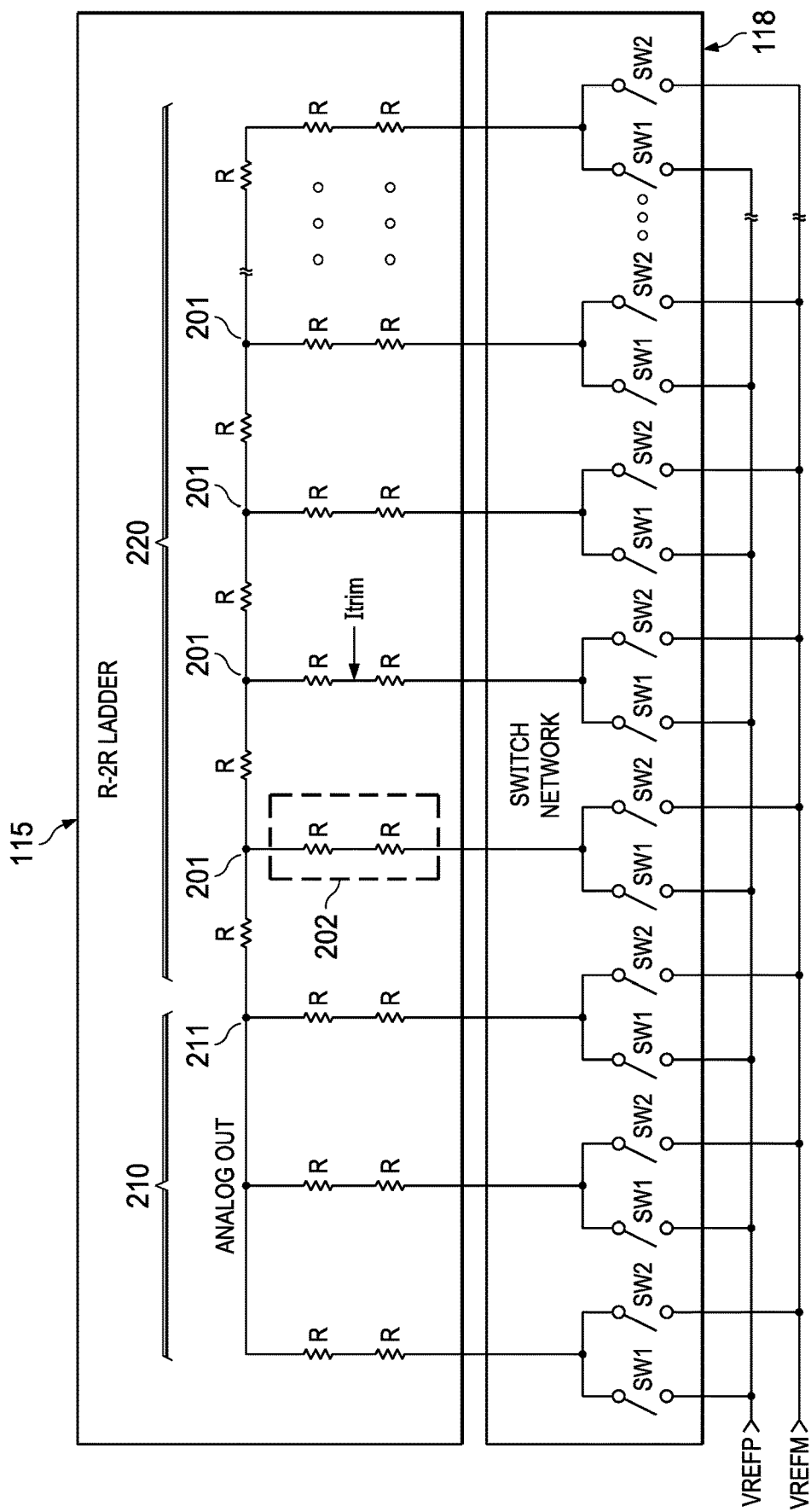
FIG. 2 illustrates an R-2R ladder for use in the DAC of FIG. 1.

FIG. 2 shows an example of the R-2R ladder 115 and the switch network 118. The R-2R ladder includes multiple "arm" of resistors (R). Some of the arms are thermometric arms 210 and other arms are binary arms 220. All of the resistors R nominally have the same resistance value (also referred to as "R"). Each thermometric arm 220 includes a series connection of resistors R between the output voltage node and a pair of switches SW1 and SW2 within the switch network 118. Connected to the node (e.g., node 201) between each adjacent pair of resistors in the series chain within the binary arms 220 is a series-connected pair of resistors R (for example resistors 202) thereby forming a "2R". Each 2R pair of resistors is also connected to a pair of switches SW1 and SW2 within the switch network 118.

Switches SW1 are connected to a first reference voltage (VREFP) and switches SW2 are connected to a second reference voltage (VREFM). In one example VREFP is +15V and VREFM is −15V, although other reference voltages can be used as well. VREF is defined as the difference between VREFP and VREFM. For VREFP of +15V and VREFM of −15V, VREF equals 30V.

The bits of the DACCODE are used to control the on/off state of switches SW1 and SW2. The M most significant bits (MSBs) of the DACCODE are converted into a thermometric code and the bits of the thermometric code turn on and off SW1 and SW2 within the thermometric arms 210. For example, a thermometric bit being a logic 1 will turn on SW1 (and turn off SW2) within a given pair of switches SW1 and SW2, and the thermometric bit being a logic 0 will turn on SW2 (and turn off SW1) within the given pair of switches. The switch decoders 120 (FIG. 1) includes a binary-to-thermometric decoder for the M MSBs of the DACCODE as well as gate drivers to level shift the bit voltages to suitable voltages for turning on and off the switches SW1 and SW2 (which may be implemented as, for example, n-type and/or p-type metal oxide field effect transistors, MOSFETs). With SW1 being on (closed) for a given ladder arm 210 or 220, VREFP is provided to the resistors of that arm. With SW2 being on (closed) for a given ladder arm 210 or 220, VREFM is provided to the resistors of that arm. The analog output voltage is taken from the node 211 as shown.

In one example, the DAC implemented on the integrated circuit 100 is a 20-bit DAC (i.e., 20 bit precision) and M equals 6. The number of thermometric arms is $2^M-1$. Thus, for M equal to 6, there will be 63 thermometric arms 210. The number of binary arms 220 equals the N least significant bits of the DACCODE (M+N equals to the total number of bits of the DACCODE).

Referring back to FIG. 1, the DNL calibration circuit 140 generates a DNL-CODE to be converted to an Itrim current by the IDAC 170 to trim the DNL errors of each of the arms of the R2R ladder 115. The memory 138 stores DNL trim coefficients which are selected by the DNL calibration circuit based on the DACCODE. The selected DNL coefficients are then added together within the DNL calibration circuit 140 to generate the DNL-CODE. The DNL trim coefficients may be computed apriori and programmed into the memory 138 via the interface 126.

As noted above, the system described herein addresses the problem of unit resistor self-heating. Temperature-related properties of a resistor include the resistor's temperature coefficient (TC) and the resistor's self-heating coefficient (SHC). TC is a value that indicates how much the resistance will change as ambient temperature to which the resistor is exposes changes. SHC is a value that indicates how much the temperature of the resistor itself will increase due to current flowing through the resistor itself. The percentage change in resistance ($\Delta R/R$) is given by:

$$\frac{\Delta R}{R} = (TC*SHC)*Id^2 \qquad (1)$$

where Id is the current density through the resistor:

$$Id = \frac{V}{W*R} \qquad (2)$$

where V is the voltage across the resistor and W is the width of the resistor (e.g., the distance across the body of the resistor). As voltage (V) increases across a given resistor (R), its current density (Id) increases current through resistor per Eq. (2) above. Consequently, if Id increases, then $\Delta R/R$ also increases. Knowing how the resistance of the unit resistors will change due to self-heating can be used by the self-heating calibration circuit 148 to reduce the effect of self-heating. The nominal unit resistance value (R) is known apriori as is the width W from the design of the resistor. To compute, $\Delta R/R$, however, the product of TC and SHC is needed. The self-heating coefficient estimator 145 (described below) is used to produce values of TC and SHC and/or the product of TC and SHC.

Figure 3:
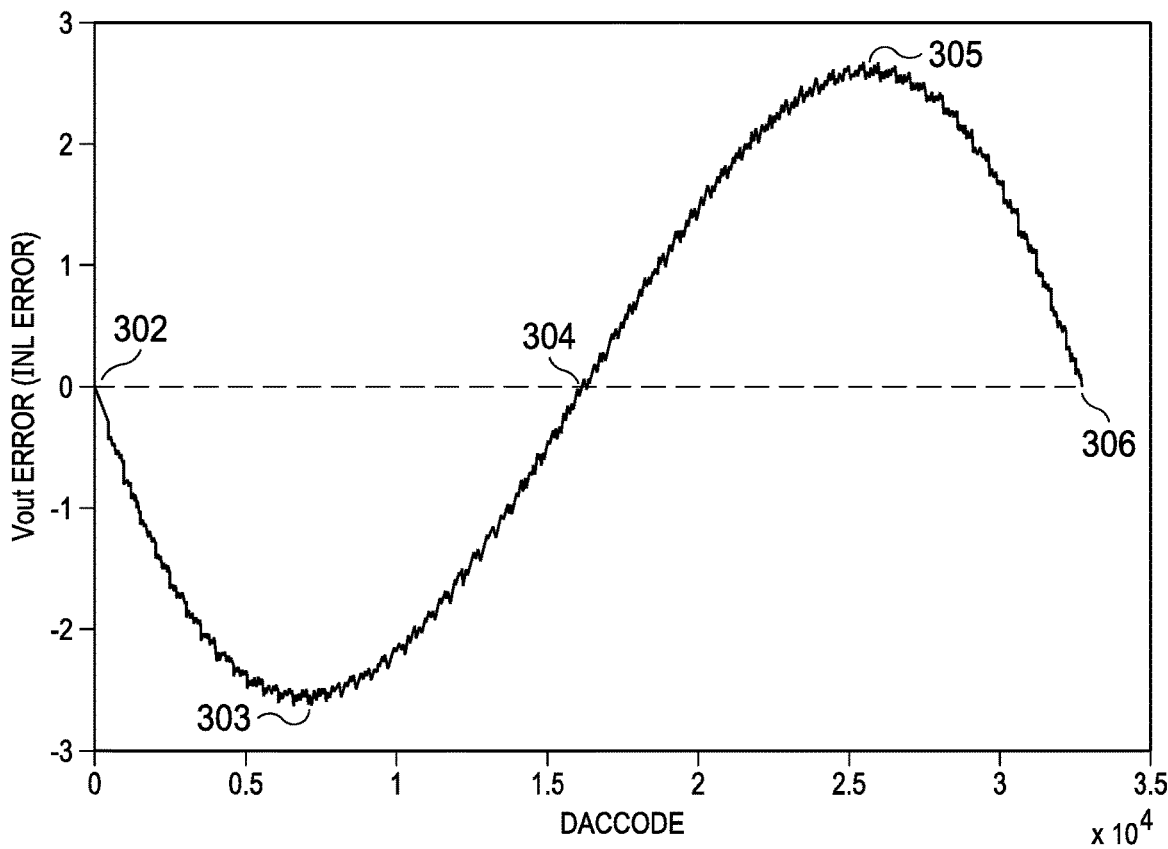
FIG. 3 illustrates integral nonlinearity (INL) error as a function of the DAC code due to self-heating artifacts.

The effect on the INL error of the output voltage Vout is shown in FIG. 3. The INL error is a function of DACCODE and generally follows an S-shape as shown. The INL error is zero at the lowest DACCODE (000 . . . 0) (302), the maximum DACCODE (111 . . . 11) (306) and the mid code DACCODE (304). The maximum negative INL error occurs at ¼ DACCODE (303) and the largest positive Vout error occurs at ¾ DACCODE (305). The equation for the maximum INL error is:

$$\text{Max}_{E_{LSB}} = +/- \frac{3*Vref^2*TC*SHC*2^N}{128*R^2*W^2} \qquad (3)$$

where Vref is VREFP−VREFM, R, W, and N (precision of DAC) are known values. The output voltage error can thus be determined once the product of TC and SHC is determined.

Figure 4:
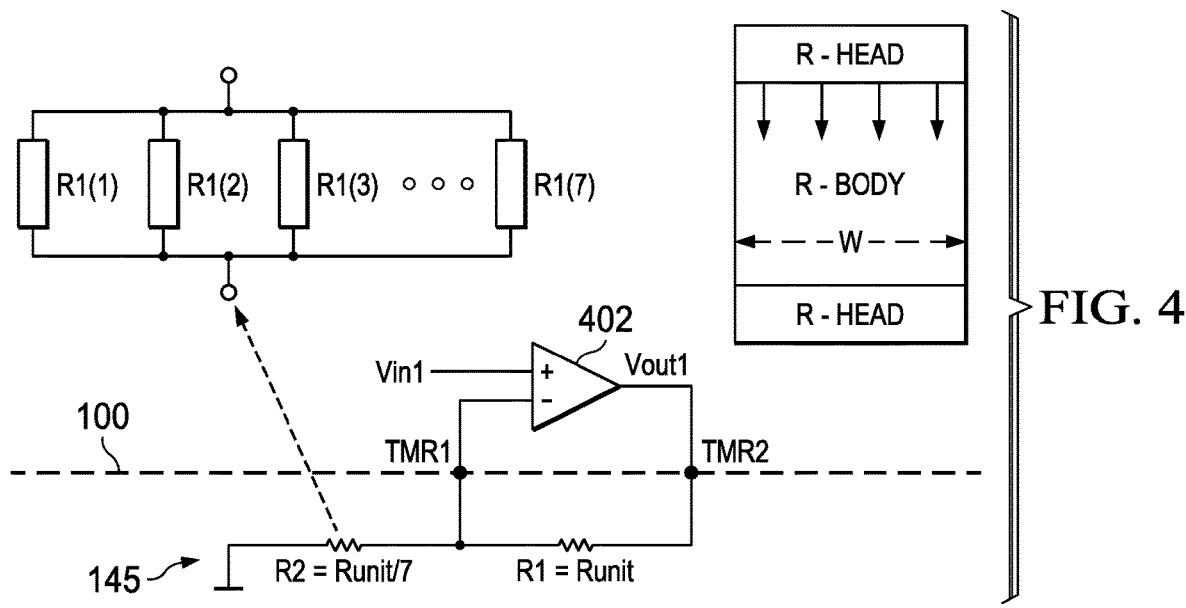
FIG. 4 shows an example of the use of a self-heating coefficient estimator on the same integrated circuit as the DAC.

FIG. 4 illustrates an example of the self-heating coefficient estimator 145 which is usable to determine the product TC*SHC. The self-heating coefficient estimator 145 includes a first resistor R1 connected to a second resistor R2. R2 is connected to a ground node within the integrated circuit 100. Both R2 and R1 are connected to externally accessible test connections. The node interconnecting R1 and R2 is connected to test connection TMR1 and the other terminal of R2 is connected to test connection TMR2. An external circuit can be connected to the test connections TMR1 and TMR2. In the example shown, the external circuit comprises an operational amplifier (op amp) 402. The inverting input (−) of the op amp is connected to test connection TMR1 and the output of the op amp is connected to the test connection TMR2. An input voltage (Vin1) is provided to the non-inverting input (+) of the op amp 402.

A calibration procedure can be performed using the op amp 402 and resistors R1 and R2 to determine the value of TC*SHC. The nominal resistance of R1 is the same as the resistance of the unit resistors R within the R-2R ladder 115. In this example, the resistance of R2, however, is R/7. The gain of the circuit comprising the op amp 402 and resistors R1 and R2 is 8. That is, the output voltage (Vout1) from op amp 402 is eight times Vin1. R2 can be produced by connecting seven unit resistors R in parallel as shown in FIG. 4. FIG. 4 also illustrates the width W of a resistor as the distance across its body between the heads of the resistor.

In accordance with one example for determining TC*SHC, the input voltage Vin1 is swept from a first voltage to a second voltage while measuring the output voltage Vout1. In one specific example, the input voltage Vin1 is provided as three voltages of V1 (0V), V2 (1V), and V3 (2V). Ideally, the output voltages Vout should be 0V, 8V and 16V for these three input voltages. However, due to the temperature effects from self-heating of the resistors R1 and R2 due to different current densities in R1 versus R2, as well as the offset and gain errors, the output voltages will likely not be exactly 0V, 8V, and 16V. End-point correction is applied to the relationship between Vin1 and Vout1 to remove the offset and gain errors. End-point correction includes determining the non-linear error (Ev) at V2 (1V) between the measured output voltage and a line connecting the measured output voltages resulting from input voltages V1 (0V) and V3 (2V). The value TC*SHC is related to Ev, R1, R2, V1 and V3 by the following expression:

$$TC*SHC = \frac{Ev*R2^3*W^2}{R1*(V3^2 - 2*V1^2)} \quad (4)$$

The process described above to determine TC*SHC can be performed at the factory before shipment of the integrated circuit, by the end user of the integrated circuit, or at other times and places during the distribution chain from manufacturer to end user. The value TC*SHC can be provided over the interface 126 to the digital interface and logic 125 and stored in memory 150 as TC*SHC value 151. In some examples, once TC*SHC is determined, either TC or SHC can be determined if the other value is known, and thus either the product TC*SHC is programmed into memory 150, or the individual constituent values TC and SHC can be programmed into memory 150.

FIG. 1 shows that memory 150 includes TC*SHC value 151 as well as VREF 152 and polynomial coefficients 153. The end-user (or other entity) knows the reference voltage VREF (VREFP−VREFM) that the end-user intends to use for the DAC and programs VREF 152 into memory 150 also using the interface 126. The end-user (or other entity) also programs the polynomial coefficients 153 (described below) into the memory. These values are used in a polynomial to re-shape the INL error described above to thereby reduce the amount of INL error. Equation (3) above includes the square of Vref. Equation (3) can be rewritten as follows to provide for the "n" power of Vref.

$$\text{Max}E_{LSB} = +/- \frac{3*TC*SHC*2^N}{128*R^2*W^2} * Vref^n \quad (5)$$

For the INL shape due to self-heating of the unit resistors R, a third order polynomial corrector of the form below is sufficient to correct the INL error.

$$SHCODE = +/- \frac{3*TC*SHC*2^N}{128*R^2*W^2} *$$
$$[(DACCODE - A)*(DACCODE - B)*(DACCODE - C)]/$$
$$Knorm*Vref^n \quad (6)$$

where Knorm is a normalization factor and A, B, and C are the polynomial coefficients 153. A, B, and C are polynomial coefficients to adjust the shape of the correction polynomial and can be set by the end user and adjusted as desired.

Equation (6) above comprises a third order polynomial that can be implemented in digital logic by the self-heating calibration circuit to produce the SHCODE shown in FIG. 1. Equation (6) can be modified to simplify the digital logic required to generate the SHCODE. For example, $Vref^n$ can be modified as:

$$Vref^n = \quad (7)$$
$$\left\{\frac{Vref}{40}\right\}^n *40^n = \left\{\frac{\frac{Vref}{2.5}}{\frac{40}{2.5}}\right\}^n *40^n = \left\{\frac{Vref}{16}\right\}^n *40^n = \left\{\frac{Dv}{16}\right\}^n *40^n$$

$$Vref^n = (Dv)^n *40^n/16^n \quad (8)$$

where Dv is the digitized representation of Vref given as Dv=round(Vref/2.5). Substituting the expression for $Vref^n$ from Eq. (8) into its respective term from Eq. (6) results in $$\frac{3*TC*SHC*2^N*40^n}{128*R^2*W^2*Knorm} = K*TC*SHC.$$

The minimum step size that can be applied to the correction factor is limited by the IDAC step size which, in one example is $\frac{1}{16}^{th}$ LSB. In an example, a scaling factor of $2^{12}$ is used to represent a scaling factor (Ec) as a 9-digit integer value in 2s complement format. That is, $$Ec=\text{round}(K*TC*SHC*2^{12}) \quad (9)$$

and the resulting equation for the polynomial shape corrector is:

$$SHCODE=Ec*(DACCODE-A)*(DACCODE-B)*$$
$$(DACCODE-C)*Dv^n*2^{12}*16^{-n} \quad (10)$$

assuming a scaling factor of $2^{12}$.

Figure 5:
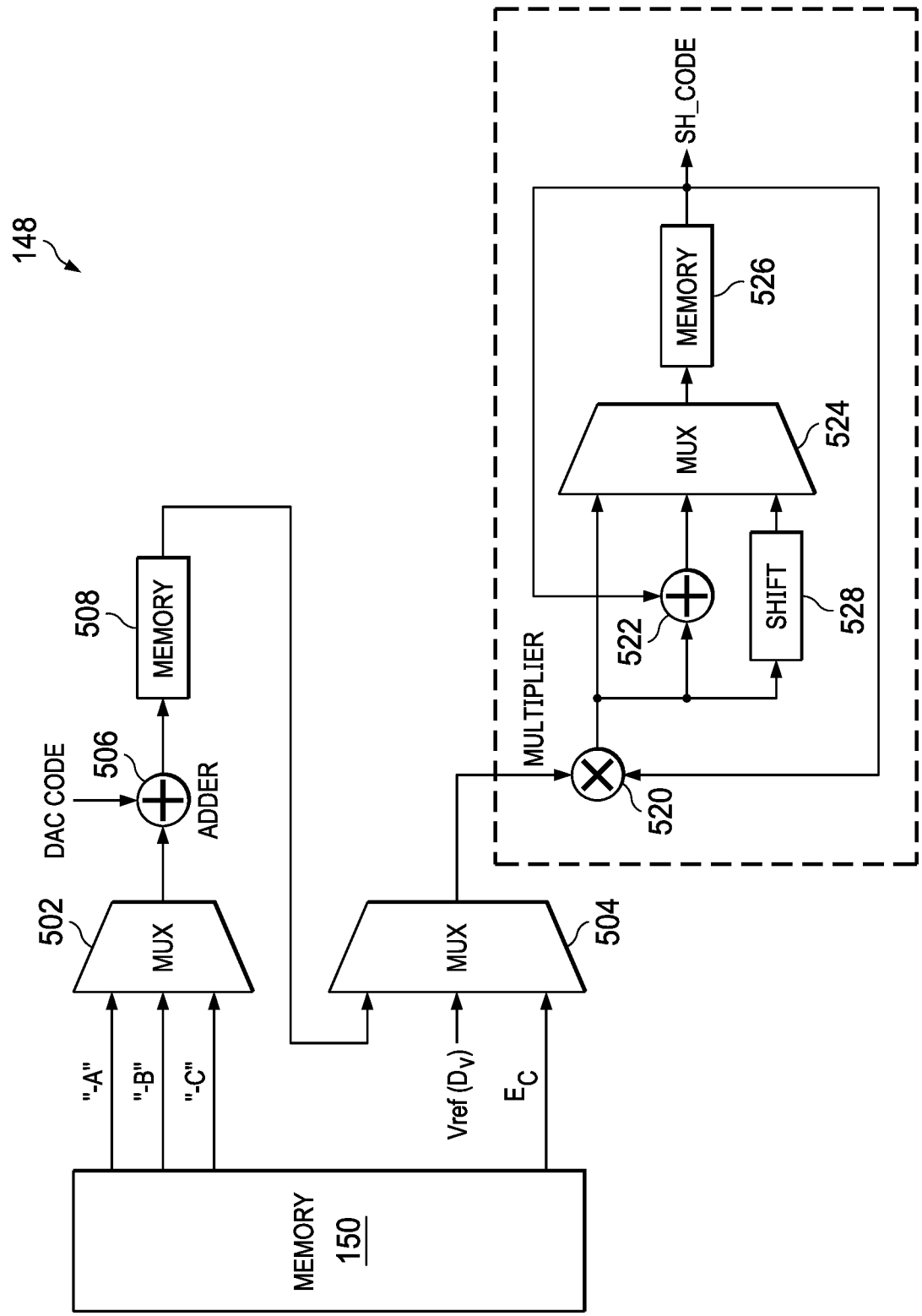
FIG. 5 shows an example of a self-heating calibration circuit associated with the DAC of FIG. 1.

FIG. 5 illustrates the implementation of Eq. (9) above. The self-heating calibration circuit 148 in this example includes multiplexers 502, 504, and 524, adders 506 and 522, memory (e.g., random access memory, RAM) 508 and 526, multiplier 520, and shift register 528. As explained above, memory 150 is used to store the polynomial coefficients A, B, and C. In the example of FIG. 5, the negative of the polynomial coefficients are stored in memory 150 (that is, −A, −B, and −C). Through selection of each polynomial coefficient, the subtraction values DACCODE-A, DACCODE-B, and DACCODE-C are determined by the adder 506 and each such subtraction value is stored in memory 508.

The three terms DACCODE-A, DACCODE-B, and DACCODE-C are provided to multiplexer 504 from memory 508. The multiplexer 504 also receives the digitized version of VREF (Dv) and, from memory 150, the term Ec. Sequentially, the product terms of Eq. (10) can be calculated by multiplexer 520. For example, Dv is multiplied by a value of 1 by multiplier 520 and stored in memory 526. Then, that value (Dv) is multiplied by Dv and the result ($Dv^2$) is stored in memory 526. The process of multiplying by Dv is repeated until the value $Dv^n$ is generated and stored in memory 526. Then, the resulting product $Dv^n$ is multiplied by Ec to product the product $Ec*DV^n$. When the term DACCODE-A is available from multiplexer 504, DACCODE-A is multiplied by $EC*DV^n$. Each such product is stored through multiplexer 524 into memory 526 and then fed back to the multiplier 520 for multiplying by the next input term from multiplexer 504. In this way, (DACCODE-A)*($EC*DV^n$) is then multiplied by DACCODE-B, and that resulting product is then multiplied by DACCODE-C. The order at which the terms DACCODE-A, DACCODE-B, and DACCODE-C are provided through multiplexer 504 to multiplier 520 can vary from that described above. The term $2^{-12}*16^{-n}$ can be rewritten as $2^{-12}*2^{-4n}$ which equals $2^{-(12+4n)}$. The term $2^{-(12+4n)}$ is broken into multiple small right shift operations. For example, for n equals 3, $2^{-(12+4n)} = 2^{-24}$ which equals $2^{(-4)*6}$. Hence, right shift by "4" is performed for "6" different stages of multiplication, thereby achieving the net effective operation $2^{-24}$.

To correct for DNL drift with temperature, a correction technique is used that scales linearly with temperature and the magnitude of Vref. In accordance with one example, the DNL errors of the various arms 210, 220 are trimmed at one reference temperature and then trimmed again at a different reference temperature. For example, the first temperature may be room temperature (approximately 27 degrees Celsius) and the second temperature may be a substantially higher temperature (e.g., 127 degrees Celsius). The two sets of trim coefficients are stored in memory 155 as DNL coefficients 156 and 157 (although the DNL coefficients stored in memory 138 can be used for the DNL coefficients at temperature T2 (156)). In one example, the trim coefficients determined at room temperature are the same trim coefficients stored in memory 138 and used by the DNL calibration circuit 140.

Figure 6:
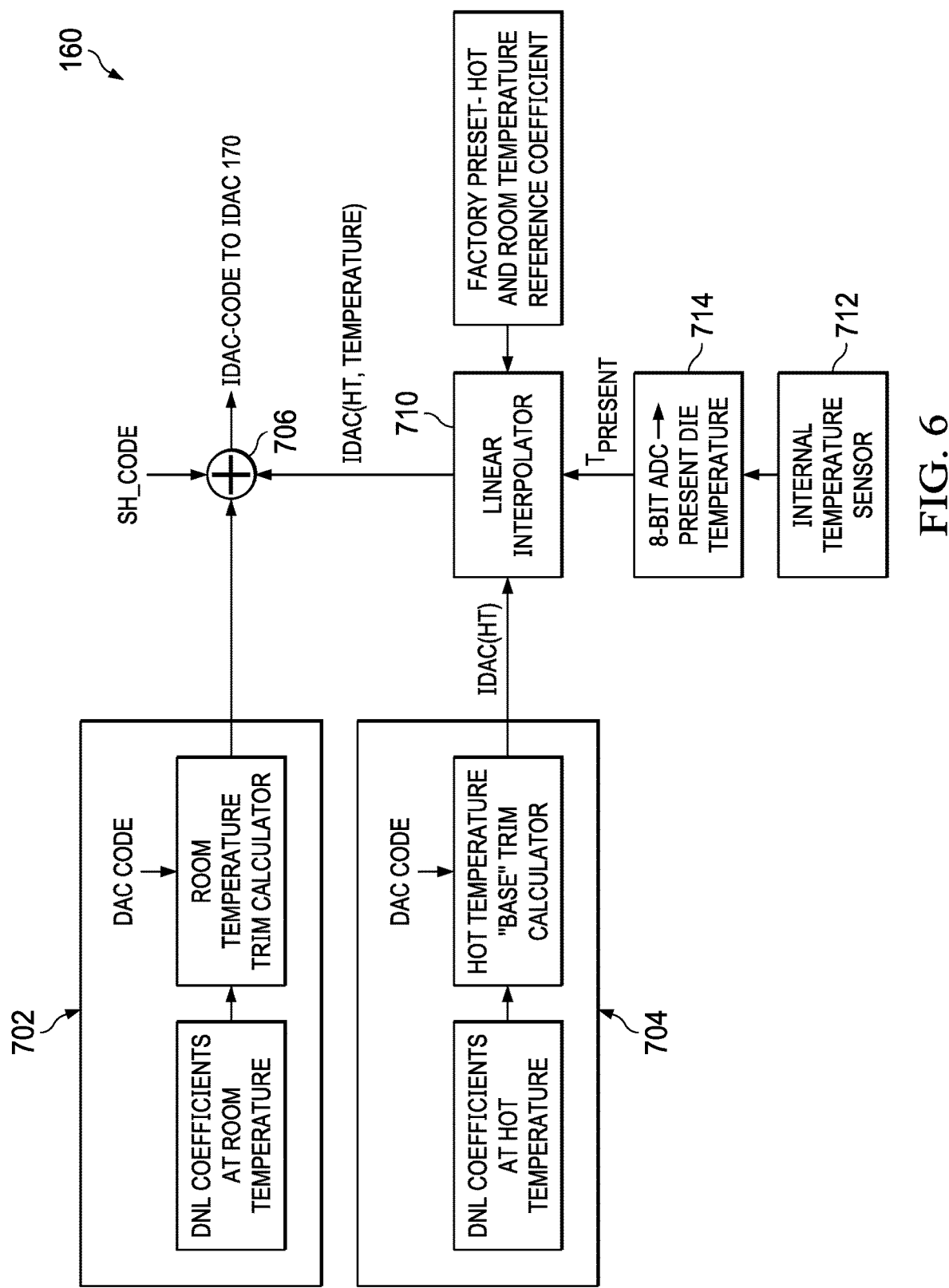
FIG. 6 shows an example of a temperature calibration circuit associated with the DAC of FIG. 1.
Figure 7:
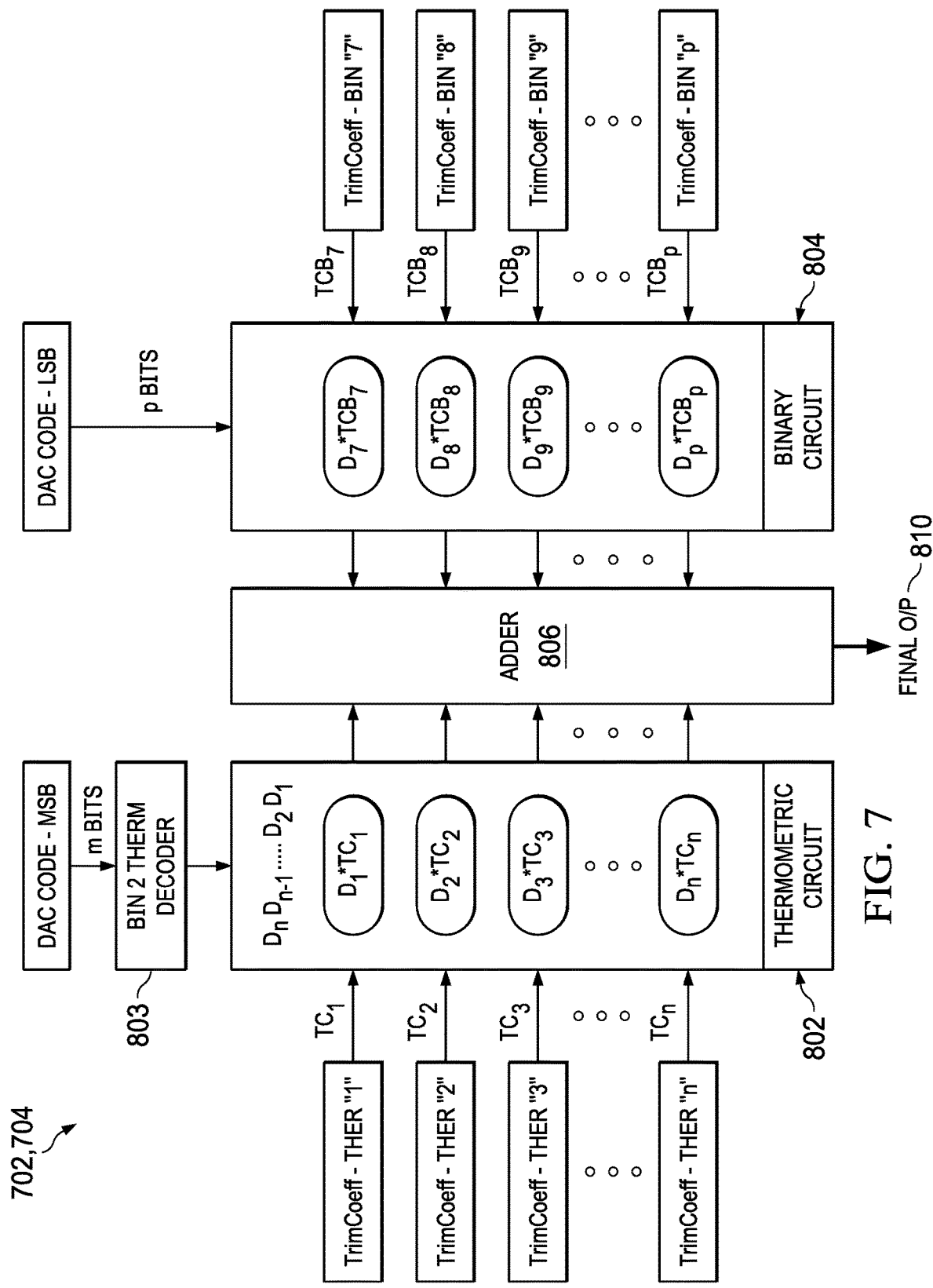
FIG. 7 shows additional detail regarding the temperature calibration circuit of FIG. 7.

FIGS. 6 and 7 illustrate an embodiment for interpolating using the two sets of DNL coefficients based on the current ambient temperature of the DAC. An example of the temperature calibration circuit 160 of FIG. 1 is shown in FIG. 6 and includes trim calculation circuits 702 and 704, adder 142 (FIG. 1), linear interpolator 710, internal temperature sensor 712, and analog-to-digital converter (ADC) 714. After calculation of trim coefficients at the first and second temperatures, the coefficients are saved in on-chip memory (e.g., memory 138 and/or memory 155). At these temperatures, the output of the temperature sensor 712 is converted to a digital value by ADC 714 and saved in memory.

During run-time, the present temperature of the die containing the circuits described herein is measured using the temperature sensor 712 and ADC 714. and interpolated/extrapolated IDAC coefficients {IDAC(HT,Temp)}, which is shown as TEMP_CODE in FIG. 1, is calculated using following equation:

$$IDAC(HT, Temp) = \frac{IDAC(HT)}{temp\_HT - temp\_RT} * (temp\_present - temp\_RT) \quad (11)$$

where, IDAC(HT)=correction coefficient determined at the higher ("Hot") temperature (HT), temp_present is the present temperature, temp_HT is the die temperature measured during hot temperature trimming, and temp_RT is the die temperature measured during room temperature (RT) temperature trimming. The circuit shown in FIG. 6 computes IDAC(HT,Temp) using the adder 142 and linear interpolator 710. In a separate set of calculations, IDAC(RT) is calculated using trim calculation circuit 702. IDAC(HT,Temp) is then added to the IDAC(RT) from the trim calculation circuit 702 along with SH_CODE from FIG. 5 to produce the trim code to the IDAC 170 to trim for DNL drift with temperature.

FIG. 7 shows an example implementation of the trim calculation circuits 702 and 704. Each trim calculation circuit includes a thermometric circuit 802, a binary-to-thermometric decoder 803, a binary circuit 804, and an adder 806. The m MSBs of the DAC code are converted to a thermometric code by the binary-to-thermometric decoder 803. Each resulting thermometric code bit is a 0 or a 1. The thermometric trim coefficients for that particular temperature (first or second temperature) is stored in memory and multiplied by the corresponding thermometric code bit (to select or not select each respective trim coefficient) and the resulting values are provided to adder 806. Following the m MSBs, the next p most significant bits of the DAC code are multiplied by the respective binary trim coefficients for the corresponding temperature and the results are also provided to adder 806. The sum of m and p need not be equal to all of the bits of the DAC code. For example, for a 20-bit DAC code, m could be 5 and p could be 4 and thus the 9 MSBs of the 20-bit DAC code are used to create the trim code. The adder 806 adds the selected trim coefficients to provide an output value 810.

Referring again to FIG. 1, the adder 142 adds the DNL-CODE produced by the DNL calibration circuit 140, the SHCODE produced by the self-heating calibration circuit 148 and the TEMP-CODE produced by the temperature calibration circuit 160 to obtain a single IDAC-CODE to be provided to the IDAC 170. The IDAC 170 generates the trim current to a corresponding arm of the R-2R ladder 115 as described above.

Figure 8:
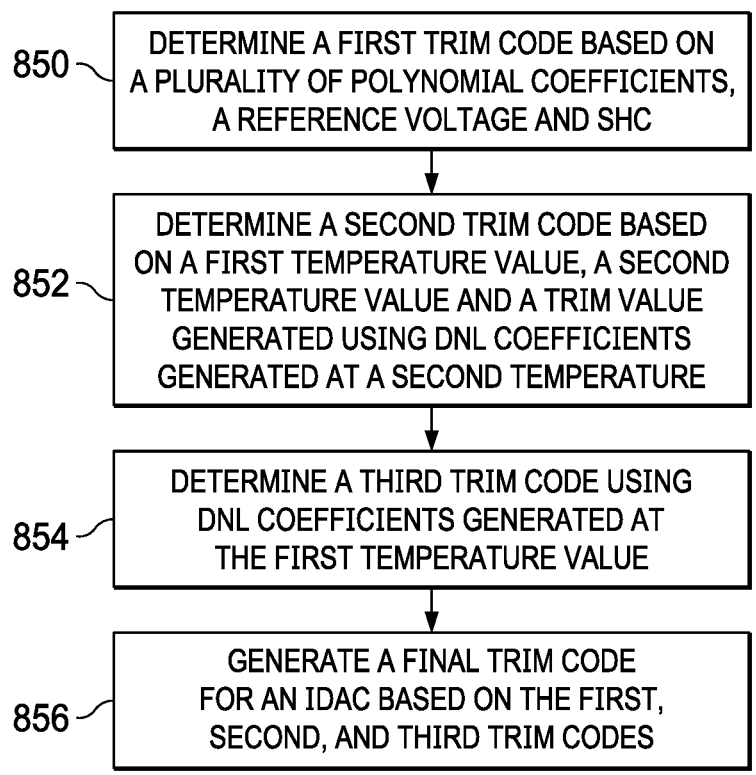
FIG. 8 includes a flow chart in accordance with an example.

FIG. 8 provides a flow chart illustrating an example method as described above. At 850, the method includes determining a first trim code based on a plurality of polynomial coefficients, a reference voltage, and a self-heating coefficient (SHC). Eqs. (6) and (10) comprise examples of how the first trim code (SH-CODE) is to be determined.

At 852, the method includes determining a second trim code based on a first temperature value (e.g., room temperature such as 27 degrees Celsius), a second temperature value (e.g., an elevated "hot" temperature such as 127 degrees Celsius), and a trim value generated using DNL coefficients generated at the second temperature value. Equation (11) is an example of how the second trim code (TEMP-CODE) is to be determined. The method further includes at 854, determining a third trim code using DNL coefficients generated at the first temperature value. In one example, the DNL calibration circuit 140 generates the third trim code (i.e., the DNL-CODE). At 856, a final trim code (e.g., IDAC-CODE) for an IDAC (e.g., IDAC 170) is determined based on the first, second and third trim codes. In one example, the first, second, and third trim codes are added together to produce the final trim code.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An integrated circuit, comprising:
   a digital-to-analog converter (DAC) comprising thermometric arms and an R-2R ladder;
   a current DAC (IDAC) coupled to the R-2R ladder;
   a self-heating calibration circuit coupled to the IDAC;
   a differential non-linearity (DNL) calibration circuit coupled to the IDAC; and
   a memory coupled to the DNL calibration circuit.

2. The integrated circuit of claim 1, further comprising:
   a first test resistor coupled to a second test resistor, wherein each of the first and second test resistors is coupled to at least one externally-accessible test connection on a chip containing the DAC; and a serial interface coupled to the DAC.

3. The integrated circuit of claim 1, further comprising:

an adder coupled to the DNL, the self-heating calibration circuit and the IDAC;

a temperature sensor; and a temperature calibration circuit coupled to the adder.

4. The integrated circuit of claim 3, wherein the adder is to add a temperature trim code with a value indicative of the DNL coefficients and a self-heating trim code to generate an IDAC trim code.

5. The integrated circuit of claim 1, wherein the self-heating calibration circuit is to generate a self-heating trim code based on a value from the memory as well as a reference voltage used by the DAC.

6. The integrated circuit of claim 1, wherein the self-heating calibration circuit is to generate a self-heating trim code based on a value from the memory as well as coefficients programmed into the memory.

7. The integrated circuit of claim 1, wherein the self-heating calibration circuit is to generate a self-heating trim code based on a value from the memory as well as a reference voltage used by the DAC and coefficients programmed into the memory.

8. An integrated circuit, comprising:

a digital-to-analog converter (DAC) comprising thermometric arms and an R-2R ladder;

a current DAC (IDAC) coupled to the R-2R ladder;

an adder coupled to the IDAC;

a differential non-linearity (DNL) calibration circuit coupled to the adder;

a temperature sensor;

a temperature calibration circuit coupled to the adder; and a self-heating calibration circuit coupled to the adder.

9. The integrated circuit of claim 8, further comprising a serial interface coupled to the DAC.

10. The integrated circuit of claim 8, wherein the self-heating calibration circuit is to generate the self-heating trim code based on a value indicative of the product of a resistor temperature coefficient (TC) and a resistor self-heating coefficient (SHC) as well as a reference voltage used by the DAC.

11. The integrated circuit of claim 8, further comprising a serial interface configured to receive from a source external to the integrated circuit, coefficients, and wherein the self-heating calibration circuit is to generate the self-heating trim code based on the value indicative of the product of TC and SHC as well as the coefficients.

12. The integrated circuit of claim 11, wherein the self-heating calibration circuit is to generate the self-heating trim code based on a value indicative of the product of resistor temperature coefficient (TC) and a resistor self-heating coefficient (SHC) and the coefficients and also a reference voltage used by the DAC.

* * * * *